(12) United States Patent  
Seguine (10) Patent No.: US 8,816,704 B1
(45) Date of Patent: Aug. 26, 2014

(54) AUTOMATICALLY BALANCED SENSING DEVICE AND METHOD FOR MULTIPLE CAPACITIVE SENSORS

(75) Inventor: Dennis Seguine, Temecula, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 174 days.

(21) Appl. No.: 13/278,478

(22) Filed: Oct. 21, 2011

Related U.S. Application Data

(60) Continuation of application No. 12/367,279, filed on Feb. 6, 2009, now Pat. No. 8,072,230, and a division of application No. 11/395,417, filed on Mar. 31, 2006, now Pat. No. 7,504,833.

(60) Provisional application No. 60/667,654, filed on Apr. 1, 2005.

(51) Int. Cl.
 *G01R 35/00* (2006.01)
 *G01R 27/26* (2006.01)

(52) U.S. Cl.
 CPC .......... *G01R 35/00* (2013.01); *G01R 27/2605* (2013.01)
 USPC ........................................................ 324/679

(58) Field of Classification Search
 USPC ........................................................ 324/679
 See application file for complete search history.

(56) References Cited

U.S. PATENT DOCUMENTS

| | | |
|---|---|---|
| 4,113,378 A | 9/1978 | Wirtz |
| 4,266,144 A | 5/1981 | Bristol |
| 4,305,135 A | 12/1981 | Dahl et al. |
| 4,831,325 A | 5/1989 | Watson, Jr. |
| 5,047,725 A | 9/1991 | Strid et al. |
| 5,374,787 A | 12/1994 | Miller et al. |
| 5,495,077 A | 2/1996 | Miller et al. |
| 5,648,642 A | 7/1997 | Miller et al. |
| 5,730,165 A | 3/1998 | Philipp |
| 5,841,078 A | 11/1998 | Miller et al. |
| 5,854,625 A | 12/1998 | Frisch et al. |
| 5,861,583 A | 1/1999 | Schediwy et al. |
| 5,914,465 A | 6/1999 | Allen et al. |
| 5,920,310 A | 7/1999 | Faggin et al. |
| 5,942,733 A | 8/1999 | Allen et al. |
| 6,184,871 B1 | 2/2001 | Teres et al. |
| 6,188,391 B1 | 2/2001 | Seely et al. |
| 6,285,308 B1 | 9/2001 | Thies et al. |
| 6,323,846 B1 | 11/2001 | Westerman et al. |
| 6,380,931 B1 | 4/2002 | Gillespie et al. |
| 6,414,671 B1 | 7/2002 | Gillespie et al. |
| 6,448,911 B1 * | 9/2002 | Somayajula .................. 341/120 |

(Continued)

OTHER PUBLICATIONS

U.S. Appl. No. 12/618,661, "Automatic Tuning of a Capacitive Sensing Device," Dana Olson, filed Nov. 13, 2009; 30 pages.

(Continued)

*Primary Examiner* — Jeff Natalini (57) ABSTRACT

A method includes generating a correction value for a capacitive sensor based on a difference between a capacitance of the capacitive sensor and a capacitance of at least one other capacitive sensor when an input to the capacitive sensor and the at least one other capacitive sensor is absent. The method further includes generating a compensated capacitance value for the capacitive sensor based on applying the correction value to a difference between the capacitance of the capacitive sensor when the input is absent and another capacitance of the capacitive sensor.

11 Claims, 6 Drawing Sheets

(56) References Cited

U.S. PATENT DOCUMENTS

| | | | |
|---|---|---|---|
| 6,570,557 | B1 | 5/2003 | Westerman et al. |
| 6,583,632 | B2 | 6/2003 | Von Basse et al. |
| 6,610,936 | B2 | 8/2003 | Gillespie et al. |
| 6,667,740 | B2 | 12/2003 | Ely et al. |
| 6,677,932 | B1 | 1/2004 | Westerman |
| 6,750,852 | B2 | 6/2004 | Gillespie et al. |
| 6,781,577 | B2 | 8/2004 | Shigetaka |
| 6,825,673 | B1 | 11/2004 | Yamaoka |
| 6,888,538 | B2 | 5/2005 | Ely et al. |
| 6,946,853 | B2 | 9/2005 | Gifford et al. |
| 7,068,039 | B2 | 6/2006 | Parker |
| 7,075,316 | B2 | 7/2006 | Umeda et al. |
| 7,078,916 | B2 | 7/2006 | Denison |
| 7,098,675 | B2 | 8/2006 | Inaba et al. |
| 7,359,816 | B2 | 4/2008 | Kumar et al. |
| 7,479,788 | B2 | 1/2009 | Bolender et al. |
| 7,504,833 | B1 | 3/2009 | Seguine |
| 8,072,230 | B1 * | 12/2011 | Seguine .................... 324/672 |
| 2002/0158185 | A1 * | 10/2002 | Nelson et al. .............. 250/201.2 |
| 2003/0091220 | A1 | 5/2003 | Sato et al. |
| 2003/0210809 | A1 | 11/2003 | Kim |
| 2004/0246158 | A1 * | 12/2004 | Leung .......................... 341/155 |
| 2005/0031175 | A1 | 2/2005 | Hara et al. |
| 2005/0073324 | A1 | 4/2005 | Umeda et al. |
| 2005/0242823 | A1 | 11/2005 | Parker |
| 2005/0275382 | A1 | 12/2005 | Stessman et al. |
| 2006/0114247 | A1 | 6/2006 | Brown |
| 2006/0197750 | A1 | 9/2006 | Kerr et al. |
| 2006/0226922 | A1 | 10/2006 | Rajagopal et al. |
| 2007/0032967 | A1 | 2/2007 | Feen et al. |
| 2012/0043970 | A1 | 2/2012 | Olson |

OTHER PUBLICATIONS

U.S. Appl. No. 60/220,921 "Method for Automatically Tuning a Capacitive Sensing Device," Dana Olson, filed Jun. 26, 2009; 13 pages.

Dennis Seguine, "Capacitive Switch Scan," AN2233a, Application Note, CY8C21x34, Apr. 7, 2005; 6 pages.

Mark Lee, "CapSense Best Practices," Cypress Semiconductor Application Note, Oct. 16, 2006; 10 pages.

The Authoritative Dictionary of IEEE Standards Terms, 2000, IEEE Press Publications, 7th Edition, pp. 1133-1134; 4 pages.

USPTO Advisory Action for U.S. Appl. No. 11/395,417 dated Jul. 6, 2007; 3 pages.

USPTO Advisory Action for U.S. Appl. No. 11/512,042 dated Feb. 23, 2011; 3 pages.

USPTO Advisory Action for U.S. Appl. No. 12/367,279 dated Jun. 25, 2010; 3 pages.

USPTO Final Rejection for U.S. Appl. No. 11/395,417 dated Apr. 24, 2007; 9 pages.

USPTO Final Rejection for U.S. Appl. No. 11/512,042 dated Dec. 21, 2010; 7 pages.

USPTO Final Rejection for U.S. Appl. No. 12/367,279 dated Apr. 1, 2010; 6 pages.

USPTO Non-Final Rejection for U.S. Appl. No. 11/395,417 dated Apr. 25, 2008; 7 pages.

USPTO Non-Final Rejection for U.S. Appl. No. 11/395,417 dated Oct. 26, 2006; 13 pages.

USPTO Non-Final Rejection for U.S. Appl. No. 11/395,417 dated Nov. 1, 2007; 8 pages.

USPTO Non-Final Rejection for U.S. Appl. No. 12/367,279 dated Oct. 29, 2009; 8 pages.

USPTO Non-Final Rejection, U.S. Appl. No. 11/512,042, dated Jul. 13, 2010, 14 pages.

USPTO Notice of Allowance for U.S. Appl. No. 11/395,417 dated Nov. 6, 2008; 7 pages.

USPTO Notice of Allowance for U.S. Appl. No. 12/367,279 dated Aug. 23, 2010; 7 pages.

USPTO Notice of Allowance for U.S. Appl. No. 12/367,279 dated Mar. 14, 2011; 5 pages.

USPTO Notice of Allowance for U.S. Appl. No. 12/367,279 dated Jul. 13, 2011; 5 pages.

USPTO Notice of Allowance for U.S. Appl. No. 12/367,279 dated Nov. 26, 2010; 4 pages.

USPTO Advisory Action for U.S. Appl. No. 12/618,661 dated Apr. 9, 2013; 3 pages.

USPTO Final Rejection for U.S. Appl. No. 12/618,661 dated Sep. 18, 2012; 15 pages.

USPTO Non-Final Rejection for U.S. Appl. No. 12/618,661 dated Mar. 13, 2012; 12 pages.

* cited by examiner

AUTOMATICALLY BALANCED SENSING DEVICE AND METHOD FOR MULTIPLE CAPACITIVE SENSORS

This application is a continuation of U.S. patent application Ser. No. 12/367,279, filed Feb. 6, 2009, which is a divisional of U.S. patent application Ser. No. 11/395,417, filed Mar. 31, 2006, now U.S. Pat. No. 7,504,833, issued Mar. 17, 2009, which claims the benefit of U.S. provisional patent application Ser. No. 60/667,654, filed Apr. 1, 2005.

TECHNICAL FIELD

The present invention relates generally to electronic circuits, and more particularly to circuits related to capacitive sensors, including capacitive switches.

BACKGROUND OF THE INVENTION

Capacitive switches may be used as a replacement for mechanical switches in applications requiring an on/off action. A conventional capacitor switch can calibrate a single sensor, and apply filtering to try and eliminate changes on a time based algorithm. A typical conventional switch can use a single sensor, which can make the circuit susceptible to invalid readings due to movement of other capacitive bodies near the single sensor. In many applications, a conventional capacitance switch can "trip" when an object comes in close proximity.

Figure 6:
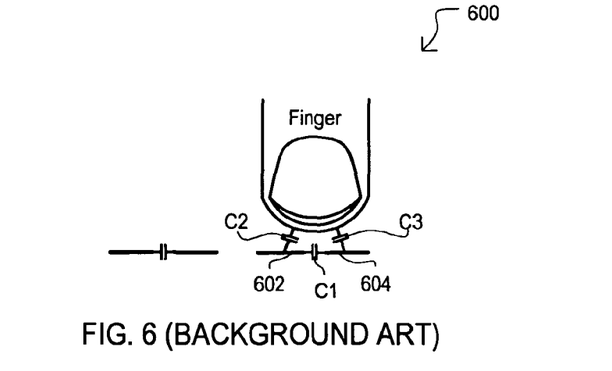
FIG. 6 is a diagram of a one type of conventional capacitive sensor.

A conventional capacitive switch will now be described with reference to FIG. 6. A conventional capacitive switch can operate by measuring a capacitance between an active switch area and an adjacent grounded area. Two conductive plates 602, 604 (or lines or some other geometric structure), one of which is active, can have a finite capacitance C1 between them. When a finger (or other conductive surface) is placed in close proximity, the capacitance changes, as shown by capacitance C2, C3.

Conventional linear slide switches and track pads can often have algorithms which require interpolation of the position between physical switches. These conventional algorithms can use curve-fitting or centroid calculations that can be easily disturbed by imbalanced sensitivity. Systems with individual switches can also be operationally sensitive to variations in switch sensitivity.

Conventional methods of measuring capacitance include charge transfer methods and relaxation oscillator methods. In either case, a capacitance switch sensitivity can be affected by identically by parasitic capacitance as sensitivity can vary as the inverse of the square of the parasitic capacitor.

Figure 7:
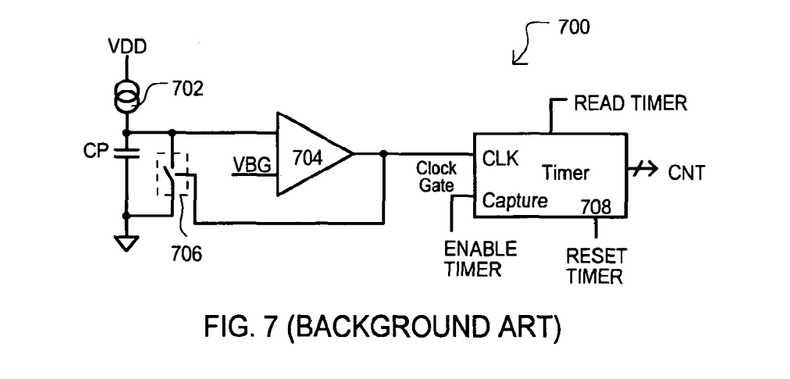
FIG. 7 is a block schematic diagram of a conventional relaxation oscillator type capacitance sensing circuit.

A conventional relaxation oscillator circuit is shown in FIG. 7. Relaxation oscillator circuit 700 utilizes a current source 702 to charge a capacitor CP. When the voltage on the capacitor reaches a specific threshold VBG, a comparator 704 can be tripped. An output of comparator 704 can drive a switch 706 that can shunt a charge on capacitor CP to ground, resulting in the comparator output returning to an initial state. The transitioning at the output of comparator 704 produces an oscillating signal. Oscillating signal can drive a timer 708.

A timer 708 can generate a count value CNT based on the number of received oscillations from comparator 704 within a set period of time. A count value CNT can be output in response to a READ TIMER signal. A timer 708 can be enabled in response to a ENABLE TIMER signal, and can reset a count value CNT in response to a RESET TIMER signal.

An oscillation rate is determined by the value of the capacitor, the size of the current source and the reset time of the switch. Typical operating frequencies can be in the range of hundreds of kHz to low MHz. Neglecting time delays in the comparator and reset switch, an oscillator frequency ca be represented by relatively simple equations.

A voltage on a capacitor rises linearly to a comparator can be represented by Eq. 1. An operating frequency can be given by Eq. 2.

$$v(t) = \frac{i_{Charge} t}{C_P} \qquad \text{Eq. 1}$$

$$f = \frac{1}{t} = \frac{i_{Charge}}{C_P V_{TH}} \qquad \text{Eq. 2}$$

where $i_{Charge}$ is a current provided by a current source 702, and $C_P$ is the capacitance of capacitor CP.

Figure 8:
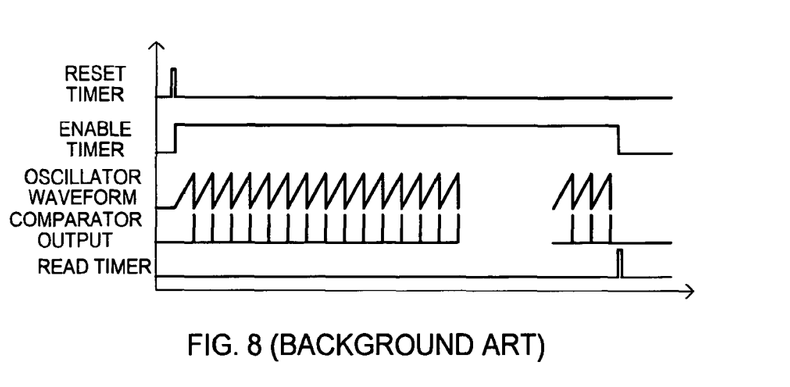
FIG. 8 is a timing showing the operation of a timer circuit shown in FIG. 7.

Referring to FIG. 8, a timing diagram shows the operation of the relaxation oscillator circuit 700 of FIG. 7.

As noted above, capacitance sensitivity can vary as the inverse of the square of the parasitic capacitor. Thus, differences in capacitance of switches can lead to non-uniform response.

A first conventional solution for compensating unwanted capacitance variation can attempt to mechanically balance the capacitive load on each switch. A second conventional compensation solution can be to test a system in the manufacturing process to determine a correction factor for each individual switch.

Disadvantages of both of conventional methods can be that they are cumbersome and difficult to use. The conventional solution of mechanically balancing the capacitive load on each switch can be a difficult analysis step, and often requires multiple board layout attempts to make a particular design work.

The other conventional solution of testing on the manufacturing line to determine a correction factor for each switch can be expensive and difficult. In addition, a conventional solution of measuring a sample of completed systems to establish a generalized set of correction factors does not work well. The sensitivity varies as the inverse of the square of the parasitic capacitor, so small changes are significantly amplified. As a result, what works well in one board sample may not work in the next if the thickness of the board varies by even a few percent.

DETAILED DESCRIPTION

Various embodiments of the present invention will now be described in detail with reference to a number of drawings. The embodiments show systems and methods that can automatically compensate for capacitance differences in a number of capacitive sensors.

Figure 1:
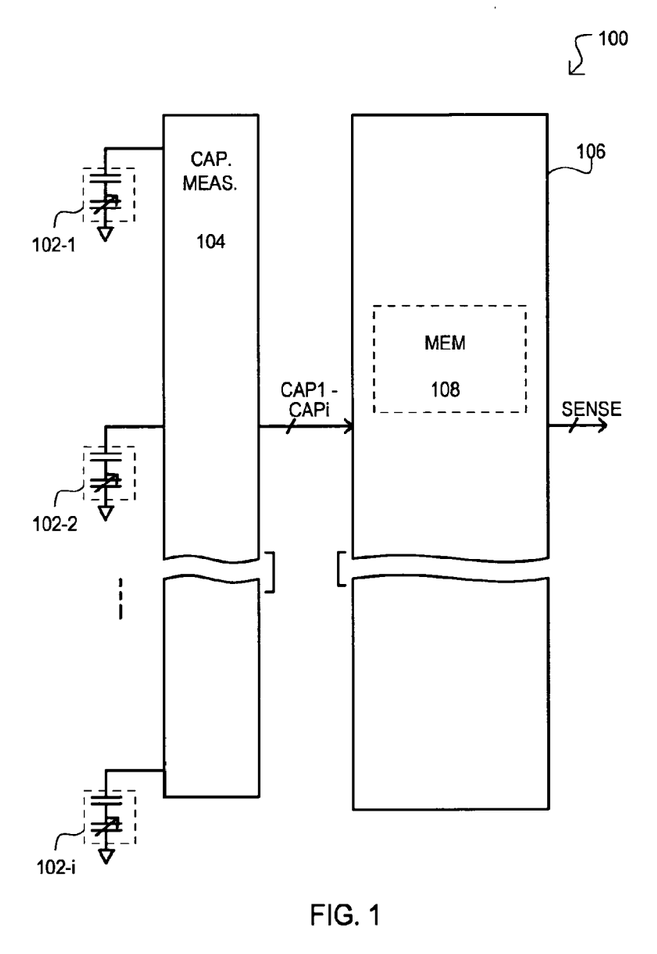
FIG. 1 is a block schematic diagram of a capacitive sensing system according to a first embodiment.

Referring now to FIG. 1, a system according to a first embodiment is shown in a block schematic diagram and designated by the general reference character 100. A capacitive sense system 100 can have inputs connected to a number of capacitive sensors 102-1 to 102-i. Each capacitive sensor (102-1 to 102-i) can have a capacitance that can vary depending upon mode of operation. More particularly, each capacitive sensor (102-1 to 102-i) can have a baseline capacitance that exists absent an input event. A baseline capacitance can be essentially constant, but can vary between capacitive sensors (102-1 to 102-i). In a run-time mode, each capacitive sensor (102-1 to 102-i) can be subject to an input even that can vary a resulting capacitance. As but one example, each capacitive sensor (102-1 to 102-i) can have a run-time capacitance that will drop in the event an object, such as a finger, is in close proximity to the sensor.

A system 100 can include a capacitance sensing section 104 and computation section 106. A sensing section 104 can generate capacitance values CAP1 to CAPi corresponding to each capacitive sensor (102-1 to 102-i). In particular, in an initial mode, sensing section 104 can sense a baseline capacitance for each sensor and provide such values to computation section 106. In a run-time mode, sensing section 104 can provide run-time capacitance values to computation section 106.

A sensing section 104 preferably generates numerical values as capacitance values (CAP1 to CAPi), even more preferably, generates count values representative of how fast a capacitance of each sensor can be charged by a constant current source. A sensing section 104 can include a sensing circuit for each input, but may preferably multiplex (MUX) inputs to a common sensing circuit.

In the event a sensing section 104 utilizing a charging rate of a capacitance as a measurement, a sensing section 104 can include one or more charging sources (e.g., current sources). In particular, one charging source may be spread among capacitive sensors in a multiplexed approach, or individual charging sources may be provided to each capacitive sensor. A charging source can take any of a number of possible forms. In one simple approach, a charging source can be a resistor that is connected directly or by way of a switching arrangement, between a capacitive sensor and a high power supply node. Alternate approaches can include current digital-to-analog converters (current DACs), or reference current sources biased according to well known temperature independent techniques (bad-gap reference, etc.).

A computation section 106 can execute predetermined arithmetic and/or logic operations. A computation section 106 can receive baseline capacitance values, and in response, generate correction factors for each capacitive sensor (102-1 to 102-i). Such a correction factor can take into account differences in capacitance between sensors and thereby provide more uniform sensitivity to input events. Correction factors can be generated based on various approaches, including but not limited to, finding a maximum capacitance, finding a minimum capacitance, or finding an average capacitance.

In the case of a maximum capacitance approach, a correction factor can increase sensitivity for those capacitive sensors having less than a maximum capacitance value. In the case of a minimum capacitance approach, a correction factor can reduce sensitivity for those capacitive sensors having more than a minimum capacitance value. In the case of an average capacitance approach, a correction factor can decrease sensitivity for those capacitance sensors having more than the average capacitance value, and increase sensitivity for those having less than the average capacitance value.

Baseline capacitance values and correction factors for each capacitive sensor (102-1 to 102-i) can be stored in a memory section 108.

Referring still to FIG. 1, in a run-time mode, a computation section 106 can receive run-time capacitance values (CAP1 to CAPi) corresponding to each capacitive sensor (102-1 to 102-i). a computation section 106 can compare each run-time capacitance values to the corresponding baseline capacitance values, and modify a result by the appropriate correction factor to generate modified sense results. Sense result can then be compared to threshold values to determine if an input event has occurred.

In one very particular result, baseline and run-time capacitance values can be count values. A computation section 106 can subtract a run-time value from a baseline value to arrive at a raw sense result. The difference value can then be multiplied by a corresponding correction factor to arrive at a modified sense result.

In this way, sensitivity between multiple capacitive sensors can be balanced.

Figure 2:
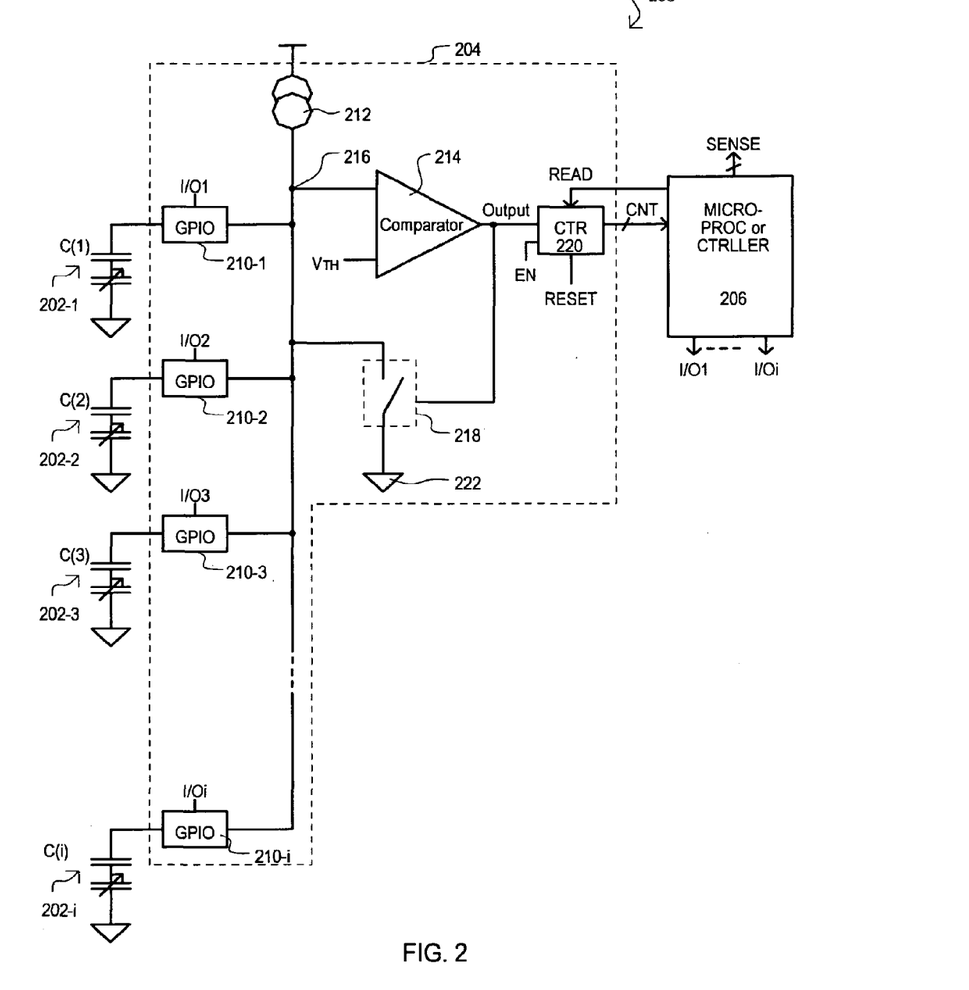
FIG. 2 is a block schematic diagram of a capacitive sensing system according to a second embodiment.

Referring now to FIG. 2, a system according to a second embodiment is shown in a block schematic diagram and designated by the general reference character 200. A system 200 can include some of the same general sections as FIG. 1, thus like sections are referred to by the same reference character, but with the first digit being a "2" instead of a "1".

In the embodiment of FIG. 2, a sensing section 204 can include a number of general purpose input/output (GPIO) cells 210-1 to 210-i, a current source 212, a comparator 214, a reset switch 218, and a counter 220. Each capacitive sensor (202-1 to 202-i) can be tied to a corresponding GPIO cell (210-1 to 210-i). Individual GPIO cells (210-1 to 210-i) can be connected to a common bus 216 in a multiplexer type fashion. GPIO cells (210-1 to 210-i) can each be controlled by corresponding I/O signals I/O0 to I/Oi.

Current source 212 can be connected to common bus 216 and provide a current. Such a current can be constant current when making capacitance measurements (i.e., baseline and run-time measurements). Preferably, current source 212 can be programmable to accommodate switch capacitances of different values. Reset switch 218 can be connected between common bus 216 and a low power supply node 222. Reset switch 218 can be controlled according to an output comparator 214.

Comparator 214 can have one input connected to common bus 216, a second input connected to a threshold voltage Vth and an output connected to reset switch 218 and to counter 220.

Counter 220 can be a gated counter that can accumulate transitions at the ouput of comparator 214. In particular, in response to an enable signal EN, counter 220 can perform a counting operation. In response to a reset signal RESET, counter 220 can reset a count value to some predetermined starting value (e.g., 0). In response to a read signal READ, counter 220 can output an accumulated count value CNT. In one very particular arrangement, a counter 220 can be a 16 bit timer with an externally triggered capture function.

In operation, compare section 204 can multiplex capacitance readings by sequentially enabling (e.g., placing in a low impedance state) GPIO cells (210-1 to 210-$i$). While one GPIO cell is enabled, current source 212 can charge the capacitance of the corresponding capacitive sensor. Once a potential at common bus 216 exceeds voltage $V_{TH}$, an output of comparator 214 can transition from an inactive to active state, turning on reset switch 218, thus discharging common bus 216. The process repeats to generate an oscillating signal at the output of comparator 214. Such an oscillation rate can be counted by counter 220 to generate a count value. Once a count value has been acquired from one capacitive sensor, the current GPIO cell can be disabled and a new GPIO cell enabled. The operation can then be repeated to generate count values for all capacitive sensors of interest. In this way, capacitance values can be acquired for all capacitive sensors (202-1 to 202-$i$) in both a baseline mode and a run-time mode.

A number of count accumulated by counter 220 can be a function of the oscillation frequency (i.e., output of comparator 214), and can be given Eq. 3:

$$n - t_{Count} f = \frac{t_{Count} i_{Charge}}{C_P V_{TH}} \qquad \text{Eq. 3}$$

Where n is count value, $t_{Count}$ is the time a count value is accumulated, $i_{Charge}$ is a current provided by current source 212, and $C_P$ is a capacitance presented by the measured capacitive sensor.

Note that for a given count window, the number of counts can be inversely proportional to the value of the switch capacitance ($C_P$). In a touch sensor arrangement, when a finger is placed on a capacitive switch, the capacitance goes up to $C_P + C_F$ and thus the number of counts can decrease. Such a count reduction can be given by Eq. 4, where $C_F$ is an additional capacitance arising from the finger.

$$n = t_{Count} f = \frac{t_{Count} i_{Charge}}{(C_P + C_P) V_{TH}} \qquad \text{Eq. 4}$$

An input even (i.e., switch detection) can be made by comparing a count value generated by an input even (e.g., finger touch), to a count value without such an event. Such a comparison can give a count difference ( ), and be represented by Eq. 5.

$$\Delta n = \frac{t_{Count} i_{Charge}}{V_{TH}} \left( \frac{1}{C_P} - \frac{1}{C_P + C_F} \right) \qquad \text{Eq. 5}$$

$C_F$ is typically much smaller than $C_P$ ($C_F > 5\%$ of $C_P$ is considered a good signal). Thus, Eq. 5 can be simplified to Eq. 6.

$$\Delta n = \frac{t_{Count} i_{Charge}}{V_{TH}} \frac{C_F}{C_P^2} \qquad \text{Eq. 6}$$

In many conventional touch sensing arrangements, capacitive switches can be arranged into an array. Further, it is not uncommon in an array of capacitive switches for $C_P$ to vary by as much as 50% form smallest to largest (as in from shortest trace to longest). This can result in a sensitivity variation of as much as 2.25 to 1. This can adversely affect position detection calculations. For example, when "center of mass" or "centroid" calculations are used to interpolate the position between adjacent switches in a linear slide switch or track-pad, these calculations are adversely affected by the $C_P$ mismatch.

As noted above, calculation section 206 can address such variations by generating a correction factor corresponding to each capacitive sensor. The calculation section 206 of FIG. 2 can include a microprocessor core that receives count values from counter 220, and executes arithmetic operations to generate correction factors. In the arrangement of FIG. 2, calculation section 206 can also output I/O signals (I/O1 to I/Oi) to control the multiplexing measurement of capacitive sensors.

Of course, a microprocessor core represents by one type of calculation section. Alternate embodiments could be realized by an application specific integrated circuit (ASIC), microcontroller, or programmable logic device, to name but a few examples.

Preferably, a system 200 can comprise a PSoC® mixed signal array made by Cypress Semiconductor Corporation of San Jose, Calif.

While the present invention can include a system that provides for compensated sensing of capacitive sensors, the present invention may also include capacitance sense methods. A few of the many possible methods will now be described.

Figure 3:
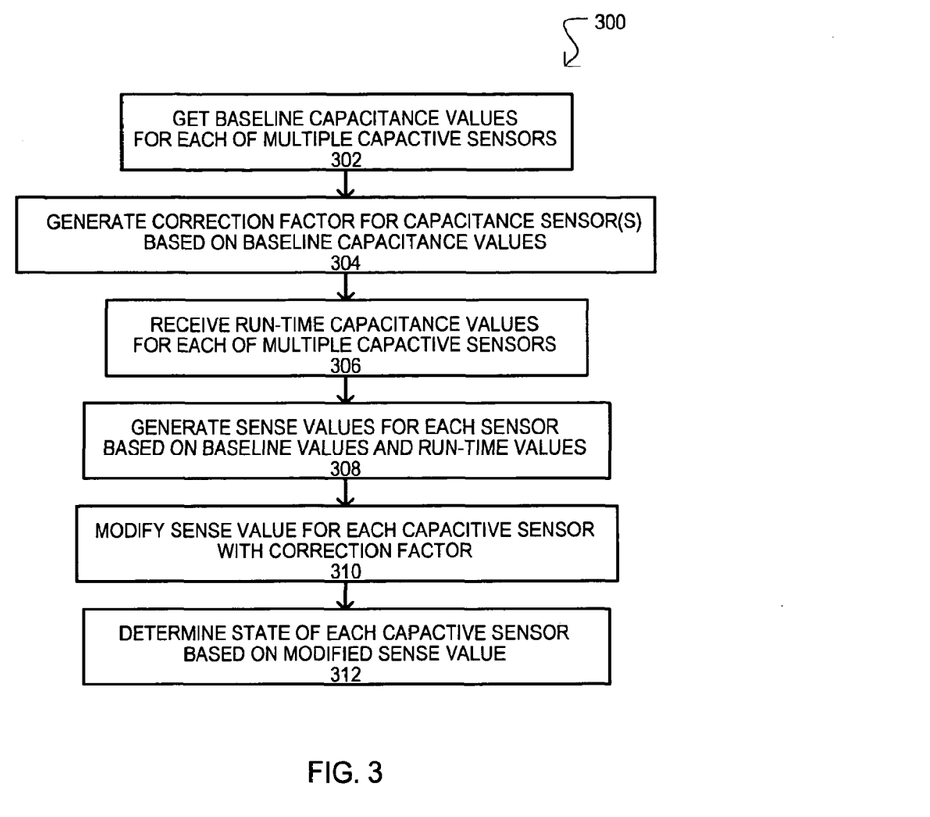
FIG. 3 is a flow diagram of a capacitive sensing method according to a third embodiment.

Referring now to FIG. 3, a method of compensating for differences in sensor capacitance is shown in a flow diagram and designated by the general reference character 300. A method 300 can include getting baseline capacitance values for each of multiple capacitive sensors (step 302). A baseline capacitance value can be capacitance presented by a sensor absent an input event, and can include undesirable parasitic capacitance or other components that contribute to variation in capacitance between sensors. In one very particular embodiment, a baseline capacitance can be a count value reflecting a charge rate of the capacitance, as described above.

Acquisition of baseline capacitance values may be done in parallel (i.e., all sensor essentially simultaneously), or may occur in a multiplexed fashion.

A method 300 can then generate a correction factor for one or more capacitive sensor (step 304). Such a correction factor can adjust the sensitivity of a sensor to compensate for inherent difference in the baseline capacitance of the sensors. In one arrangement, a correction factor can be generated according to the various methods described above, including but not limited to, basing the correction factor on a highest capacitance value form among all baseline values, a lowest capacitance value form among all baseline values, or an average capacitance value of the baseline values.

In particular embodiments, steps 302 and 304 can be part of an initial mode of operation, executed prior to sensing (e.g., run-time) operations.

Referring still to FIG. 3, a method 300 can further include receiving run-time capacitance values for each of the capacitive sensors (step 306). Run-time capacitance values can be capacitance values presented by sensors when subject to possible input events. As a result, a capacitive sensor that experiences an input event can have a capacitance that varies from its baseline value. In one particular example, a sensor capacitance value will increase when subject to an input event. In one very particular embodiment, a run-time capacitance can also be a count value reflecting a charge rate of the capacitance, as described above.

As in the case of baseline values, acquisition of run-time capacitance values may be done in parallel or in a multiplexed fashion.

A method 300 can generate a sense value for each capacitive sensor according to the baseline and runtime values for the sensor (step 308). Such a step arrives at a value that reflects any change in capacitance sufficient enough to indicate an input event. In one very particular approach, such a step can include simply subtracting a run-time count value from a baseline count value.

It is understood that sense values generated in a step 308 will reflect differences in sensitivity arising from differences in the baseline capacitance between capacitive sensors. However, method 300 can compensate for such differences by modifying each sense value with a corresponding correction factor (step 310). Such a step can provide more uniformity in sense values.

A method 300 can further include determining a state of each capacitive sensor based on modified sense values (step 312). Such a step can include determining if a modified sense value represents a sufficiently large change in capacitance to indicate an input event. In one particular case, such a step can include a simple comparison to a threshold value that can take into account noise that may variation arising from noise and/or other background events.

In this way, variations in sensitivity among multiple capacitive sensors can be balanced.

Figure 4:
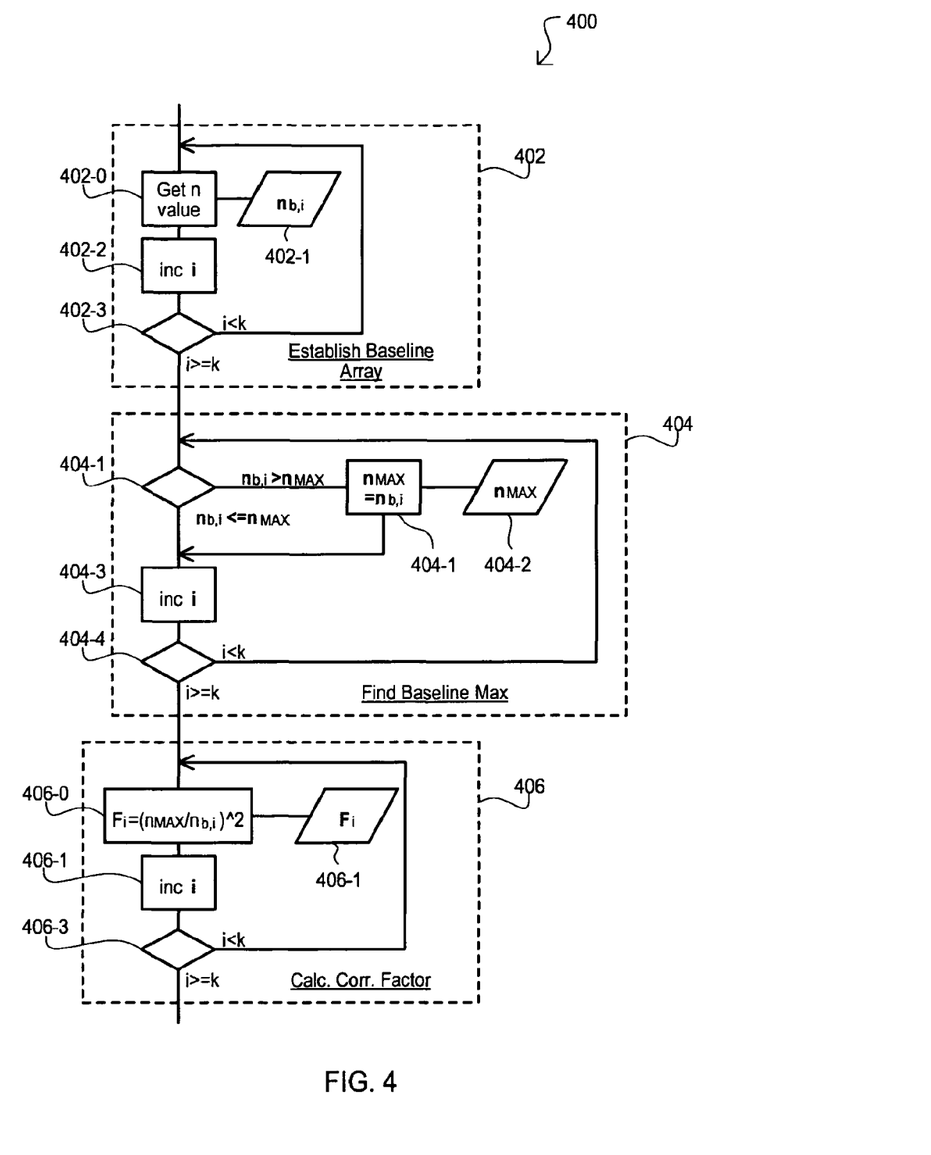
FIG. 4 is a flow diagram of a capacitive sensing method according to a fourth embodiment.

Referring now to FIG. 4, a method according to another embodiment is shown in a flow diagram, and designated by the general reference character 400. FIG. 4 shows a method of generating a correction facto used to balance an array of capacitive switches. In the method of FIG. 4 it is assumed that capacitance values are count values generated according to any of the above methods.

A method 400 can include establishing a baseline array (402). A baseline array can be data structure that contains baseline values for each of k capacitive sensors. In the particular example of FIG. 4, this can include starting with a first capacitive sensor (i=1) and acquiring a count value "n" (402-1). Such a count value can be added to an array $n_{b,j}$ (402-1). A capacitive sensor identifier "i" can then incremented (402-2) to progress to a nest sensor. The value "i" can be checked to determine if a last sensor k has been reached (402-3). Provided a last sensor has not been reached (i<k) a next baseline value can be added to the array. If a last sensor has been reached (i>=k), a method 400 can continue to section 404.

Section 404 can include analyzing baseline values based on the type of correction factor used. In the very particular example of FIG. 4, correction factors are based on a maximum baseline value. Accordingly, section 404 includes determining a maximum baseline count value $n_{MAX}$. Initially, a value nMAX can be some minimal value (e.g., 0). A baseline array $n_{b,j}$ can be accessed, with a first baseline count value, and such first value can be compared against $n_{MAX}$ (404-1). If the baseline value is greater than a current $n_{MAX}$ ($n_{b,j} > n_{MAX}$) such a baseline value can be determined to be the current $n_{MAX}$ value ($n_{MAX} = n_{b,j}$) (404-1), and the value can then be stored (404-2). If the baseline value is not greater than a current $n_{MAX}$ ($n_{b,j} <= n_{MAX}$) a value identifier "i" can be incremented (404-3) to progress to a next baseline count value. The value "i" can be checked to determine if a last baseline value k has been reached (404-4). Provided a last baseline value has not been reached (i<k) a next baseline value can be checked against a maximum value. When a last baseline value has been reached (i>=k), a method 400 can continue to section 406.

Section 406 can include calculating a correction factor. In the particular example of FIG. 4, such a step can include calculating a correction factor (406-1) according to the following equation:

$$f = \left(\frac{\max(n_{0i})}{n_{0i}}\right)^2 \qquad \text{Eq. 7}$$

Where $\max(n_{0i})$ is a maximum count value (i.e., $N_{MAX}$) AND $n_{0i}$ is the baseline value for the capacitive sensor. After such a correction factor has been calculated, it can be stored in a correction factor array Fi (406-1). A correction factor identifier "i" can be incremented (406-2) to progress to a correction factor for a next capacitive sensor. The value "i" can be checked to determine if a correction factor for a last sensor k has been reached (406-3). Provided a last sensor has not been reached (i<=k), a next correction factor can be calculated. If a last sensor has been reached (i>=k), a method 400 can conclude.

In this way, correction factors based on a maximum baseline value can be calculated that can essentially equalize sensitivity among sensors.

Figure 5:
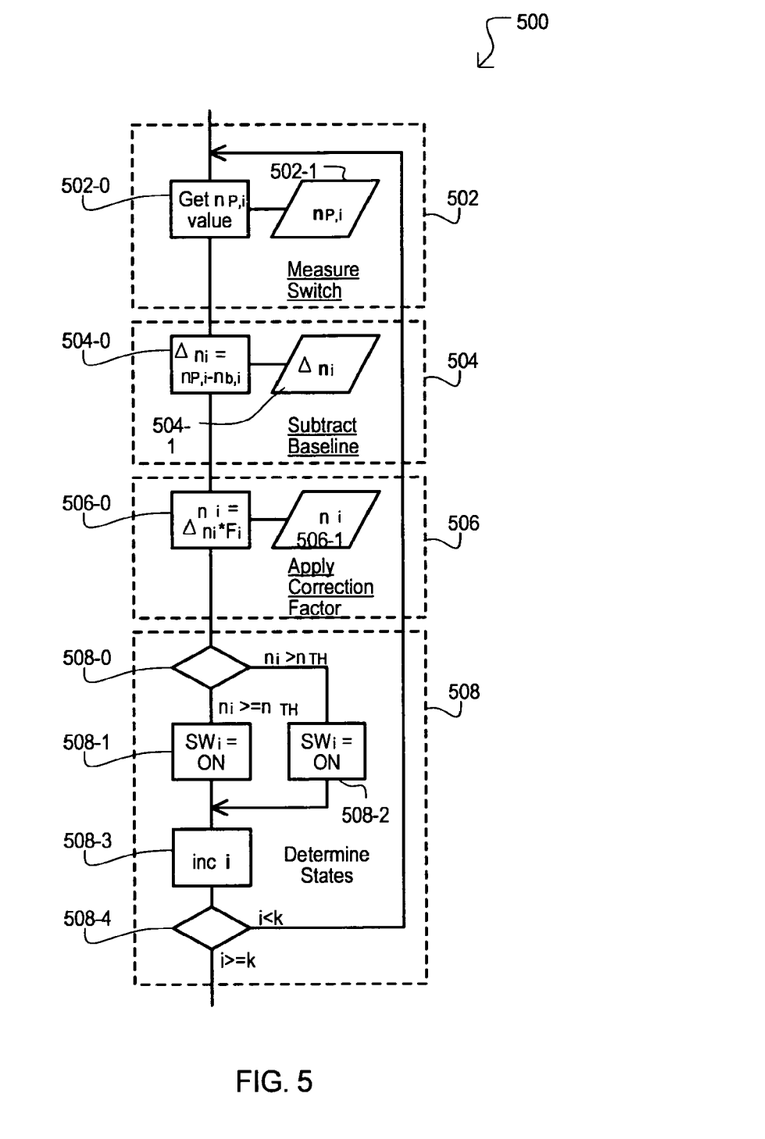
FIG. 5 is a flow diagram of a capacitive sensing method according to a fifth embodiment.

Referring now to FIG. 5, a method according to another embodiment is shown in a flow diagram, and designated by the general reference character 500. FIG. 5 shows a method of compensating for variations in the sensitivity of capacitance sensors. In the method of FIG. 5 it is assumed that capacitance values are count values generated according to any of the above methods, and that an array of correction factors Fi, has already been generated.

A method 500 can include measuring sensor (e.g., switch) capacitance values (502). Such a step can create an array that contains run-time values for each of k capacitive sensors. In the particular example of FIG. 5, this can include starting with a first capacitive sensor (i=1) and acquiring a run-time count value "$n_{P,i}$" (502-1). Such a count value can be added to an array $n_{P,i}$ (502-1).

Once a run-time value for one capacitive switch has been acquired, a sense count can be generated for the capacitive switch (504). In the example of FIG. 5, a sense count value can be generated by subtracting a run-time count value from baseline count value ($\Delta n_i = n_{B,i} - n_{P,i}$) (504-1). Such a sense count value can then be stored (504-1). In one very particular example, a sense count value $\Delta n_i$ can detect a capacitance difference between a capacitive switch with a finger and the switch without a finger.

Thus, for each switch, a stored baseline value can be subtracted from the newly acquired count value for each switch, as shown in Eq. 8.

$$=\Delta_{ni} = n_i - n_{0i} \qquad \text{Eq. 8}$$

Where $n_i$ is a run-time count value and $n_{0i}$ is the baseline value for the capacitive sensor.

Once a sense value is generated, a correction factor can be applied to the sense value (506) to compensate for variations in capacitance. In the very particular example of FIG. 5, applying a correction factor includes multiplying a sense value by the corresponding correction factor to arrive at a modified count value ni (ni=$\Delta n_i * F_i$) (506-1). Such modified count value can then be stored (506-1). In this way, a correction factor generated at an earlier time (an initial time or "boot" time), can be applied to each sense count value, to produce an array of corrected or compensated values, as shown in Eq. 9:

$$\Delta N_i = \Delta n_i F_i \qquad \text{Eq. 9}$$

where $\Delta N_i$ is the modified count value.

Once a modified count value has been generated, a state of the capacitive sensor can be determined (508). In the example of FIG. 5, this can include comparing a modified count ($n_i$) value against a threshold count value ($n_{TH}$) (508-1). If a modified count value is greater than or equal to a count value ($n_i >= n_{TH}$), a switch can be determined to be on (506-1). If a modified count value is less than a count value ($n_i < n_{TH}$), a switch can be determined to be off (506-1). Once the state of one capacitive switch has been determined, a capacitive sensor identifier "i" can be incremented (508-3) to progress to a next switch. The value "i" can be checked to determine if a last switch k has been reached (508-4). Provided a last switch has not been reached (i<k), method 500 can repeat 502 to 508 for a next switch. If a last switch has been reached (i>=k), a method 400 can conclude (or return to first capacitive switch in the array).

In this way, sense values representative of changes in the capacitance of a capacitive switch can be adjusted to take into account capacitance variations between such switches.

The above methods shown in FIGS. 4 and 5 can be used to compensate for physical variation in capacitive switches to result in an array of such switches having essentially identical sensitivity and thus behave essentially identically. Preferably, such a method can be executed as a series of steps embodied in a machine readable media by a computing device. Even more particularly, such steps can software and/or firmware executed by microcontroller or microprocessor.

According to the above methods, capacitive switches can operate with an almost uniform sensitivity. As a result, center of mass and/or centroid calculations may no longer be adversely affected by physical imbalances in switch layouts, or other factors resulting non-uniformity of capacitance, as can occur in conventional approaches.

According to the above embodiments, such correction can be done with relatively easy software at startup time and run-time time.

The above described embodiments, can advantageously proved significantly better balancing of switches, which can be very useful in interpolating switch position in linear slide switches and track pads. Such advantages can be achieved without difficult or time-consuming custom board layout and/or without separate calibration of each switch channel in the manufacturing process. In particular embodiments, such compensation can include an auto-calibration step to enable easy calculation for switch array values at run-time.

While the embodiment of FIG. 2 shows a single current source, such an arrangement should not be considered limiting to the invention. A current source can also be generalized as a fixed value resistor, one per each capacitance sensor. Such an approach may be more suitable for use in microcontroller parts that do not incorporate the large multiplex structure and current source features.

Further, in an alternate embodiment, a correction factor can be applied to any channel (e.g., input from capacitive sensor). Further, as noted above, a correction factor can be based on minimum, average, maximum or any specific channel with slight adjustment of the calibration factor. The approaches described above can be applied to relaxation oscillator frequency measurements or to charge transfer measurements.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It is understood that the embodiments of the invention may be practice in the absence of an element and or step not specifically disclosed. That is, an inventive feature of the invention can be elimination of an element.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Accordingly, while the various aspects of the particular embodiments set forth herein have been described in detail, the present invention could be subject to various changes, substitutions, and alterations without departing from the spirit and scope of the invention.

What is claimed is:

1. A method comprising:
generating a correction value for a capacitive sensor based on a difference between a capacitance of the capacitive sensor and a capacitance of at least one other capacitive sensor when an input to the capacitive sensor and the at least one other capacitive sensor is absent; and
calculating a compensated capacitance value for the capacitive sensor based on applying the correction value to a difference between the capacitance of the capacitive sensor when the input is absent and another capacitance of the measured from the capacitive sensor.

2. The method of claim 1, wherein the generating of the correction value includes determining the difference in capacitance between the capacitive sensor and the at least one other capacitive sensor when the input to the capacitive sensor is absent.

3. The method of claim 1, wherein the generating of the compensated capacitance value includes determining the difference between the capacitance of the capacitive sensor when the input is absent and the other capacitance measured from the capacitive sensor.

4. The method of claim 1, wherein the capacitance of the capacitive sensor when the input is absent is a first baseline capacitance value and the capacitance of the at least one other capacitive sensor when the input is absent is a second baseline capacitance value.

5. The method of claim 4, wherein the generating of the correction value for the capacitive sensor includes using an average baseline capacitance value of the first baseline capacitance value and the second baseline capacitance value.

6. The method of claim 4, wherein the generating of the correction value for the capacitive sensor includes determining a maximum baseline capacitance value from a set of baseline capacitance values including both the first baseline capacitance value and the second baseline capacitance value.

7. The method of claim 6, wherein the generating of the correction value for the capacitive sensor further includes dividing the determined maximum baseline capacitance value by the first baseline capacitance value of the capacitive sensor.

8. The method of claim 4, wherein the other capacitance of the capacitive sensor includes a run-time capacitance value, and the generating of the compensated capacitance value comprises:

determining the difference through subtracting the run-time capacitance value from the baseline capacitance value, and multiplying the difference by the generated correction value.

9. The method of claim 8, further comprising comparing the compensated capacitance value to a predetermined threshold value to determine if the input to the capacitive sensor is present.

10. The method of claim 9, further comprising calculating, using the compensated capacitance value, a centroid value that reflects that the input to the capacitive sensor is present.

11. The method of claim 10, further comprising determining a position of a switch by comparing the calculated centroid value to a predetermined position value.

\* \* \* \* \*